(12) United States Patent
Jang

(10) Patent No.: US 6,946,702 B2
(45) Date of Patent: Sep. 20, 2005

(54) RESISTANCE RANDOM ACCESS MEMORY

(75) Inventor: Wen-Yueh Jang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/604,627

(22) Filed: Aug. 6, 2003

(65) Prior Publication Data

US 2004/0256697 A1 Dec. 23, 2004

(30) Foreign Application Priority Data

Jun. 3, 2003 (TW) .................................... 92115025 A

(51) Int. Cl.⁷ .................. H01L 27/108; H01L 29/76; H01L 29/94; H01L 31/119
(52) U.S. Cl. .................. 257/306; 257/296; 257/298; 257/300; 257/323
(58) Field of Search .................. 257/296, 298, 257/300, 306, 323

(56) References Cited

U.S. PATENT DOCUMENTS

| | | | | |
|---|---|---|---|---|
| 5,578,511 A | * | 11/1996 | Son | 438/144 |
| 5,753,553 A | * | 5/1998 | Hikawa et al. | 438/278 |
| 5,861,645 A | * | 1/1999 | Kudo et al. | 257/291 |
| 6,087,690 A | * | 7/2000 | Chi | 257/296 |
| 6,169,318 B1 | * | 1/2001 | McGrath | 257/445 |
| 6,433,373 B1 | * | 8/2002 | Lee et al. | 257/292 |
| 6,573,586 B2 | * | 6/2003 | Sakata et al. | 257/529 |
| 6,753,562 B1 | * | 6/2004 | Hsu et al. | 257/295 |
| 6,815,784 B2 | * | 11/2004 | Park et al. | 257/421 |
| 2002/0018361 A1 | * | 2/2002 | Hoffmann et al. | 365/158 |
| 2002/0039308 A1 | * | 4/2002 | Gogl et al. | 365/158 |
| 2002/0110016 A1 | * | 8/2002 | Ooishi et al. | 365/63 |
| 2002/0181272 A1 | * | 12/2002 | Ooishi | 365/149 |

* cited by examiner

Primary Examiner—Amir Zarabian
Assistant Examiner—Ida M. Soward
(74) Attorney, Agent, or Firm—Jianq Chyun IP office

(57) ABSTRACT

The present invention provides a resistance random access memory structure, including a plurality of word lines in a substrate, a plurality of reset lines coupled to the word lines, a dielectric layer on the substrate, a plurality of memory units in the dielectric layer. Each of the memory units includes a bottom electrode, a top electrode and a resistive thin film between the top electrode and the bottom electrode. The top electrodes of the memory units in a same column e coupled to one of the reset lines and a plurality of the bit lines on the memory units. The bottom electrodes of the memory units in a same row are coupled to one of the bit lines. Because the present invention provides reset lines for Type 1R1D RRAM, it can overcome the non-erasable of the conventional Type 1R1D RRAM.

15 Claims, 7 Drawing Sheets

RESISTANCE RANDOM ACCESS MEMORY

CROSS REFERENCE TO RELATED APPLICATIONS

This application claims the priority benefit of Taiwan application serial no. 92115025, filed Jun. 3, 2003.

BACKGROUND OF INVENTION

1. Field of the Invention

This invention generally relates to a semiconductor device and method for fabricating the same, and more particularly to a resistance random access memory ("RRAM") device and method for fabricating the same.

2. Description of the Related Art

Colossal magneto resistive ("CMR") thin films and oxidation thin films having Perovskite structure are resistance-reversible materials which can be applied to reversible switching process. For colossal magneto resistive thin film, when a positive impulse (voltage) is applied to it, its resistance is programmed to high resistance; when a negative impulse (voltage) is applied, its resistance is programmed to low resistance. For the oxidation thin film having Perovskite structure, when a positive impulse (current) is applied to it, its resistance is programmed to low resistance; when a negative impulse (current) is applied to it, its resistance is programmed to high resistance. Because of their resistance-reversible features, both materials can be applied to memory devices for resistance random access memory ("RRAM"). Furthermore, because the resistance will not change even after the power source has been disconnected, RRAM is a nonvolatile memory device.

FIG. 1 shows a cross-section of a conventional RRAM device. This RRAM device is a Type 1R1D (one resistor one diode) memory device. It includes a word line (N type region) 102 in substrate 100, a plurality of P+ regions 104 and N+ region 106, wherein word line 102 and P+ region 104 constitute a diode. A dielectric layer 114 is set on substrate 100. A plurality of memory units 107 are set in dielectric layer 114, wherein each memory unit 107 includes a bottom electrode 108, a top electrode 110, and a resistive film 112 between the bottom electrode 108 and the top electrode 110. Furthermore, there is a word line contact window 116 in dielectric layer 114. One end of word line contact window 116 is electrically connected to N+ region; the other end is electrically connected to a conducting line 120 on the surface of dielectric layer 114 so that the word line 102 can electrically connects with external circuits. Furthermore, there is a bit line 118 formed on dielectric layer 114 for electrically connecting with top electrode 110 of the memory unit 107.

FIG. 1 shows a cross-section of a conventional RRAM device. This RRAM device is a Type 1R1D (one resistor one diode) memory device. It includes a word line (N type region) 102 in substrate 100, a plurality of P+ regions 104 and N+ region 106, wherein word line 102 and P+ region 104 constitute a diode. A dielectric layer 114 is set on substrate 100. A plurality of memory units 107 are set in dielectric layer 114, wherein each memory unit 107 includes a bottom electrode 108, a top electrode 110, and a resistive film 112 between the bottom electrode 108 and the top electrode 110. Furthermore, there is a word line contact window 116 in dielectric layer 114. One end of word line contact window 116 is electrically connected to N+ region; the other end is electrically connected to a conducting line 120 on the surface of dielectric layer 114 so that the word line 102 can electrically connects with external circuits. Furthermore, there is a bit line 118 formed on dielectric layer 114 for electrically connecting with top electrode 110 of the memory unit 107.

Another conventional RRAM device Type 1R1T (one resistor one transistor) memory device is shown in FIG. 2. This memory device includes a plurality of N+ regions 202 and 204 in substrate 200, wherein N+ region is a common line. A dielectric layer 220 is set on substrate 200. Dielectric layer 220 includes a plurality of memory units 207, a plurality of gate structures (word lines) 212 and a plurality of contact windows 214 and 216. Each memory unit includes a bottom electrode 206, a top electrode 208 and a resistive film 210; each memory unit is set on the surface of each N+ region. Gate structure 212 and N+ regions 202 and 204 constitute a transistor. Contact windows 214 and 216 are electrically connected to the gate structure 212 and the common line 204 respectively so that the gate structure 212 and the common line 204 can connect with the external circuits. Furthermore, there is a bit line 218 formed on dielectric layer 220 for electrically connecting with the top electrode 208 of the memory unit 207.

Type 1R1T RRAM uses the transistor to easily control the reading/programming operations of the memory device. However, the size of Type 1R1T RRAM is too big. If F represents the critical dimension ("CD"), the minimum size of Type 1R1T RRAM is 6 $F^2$.

For Type GRAD RRAM, the minimum size is 4 $F^2$, which is smaller than Type 1R1T RRAM. Hence, Type 1R1T RRAM has a higher integration density. Type 1R1T RRAM uses the diode to control the reading/programming operations. Because the diode only allows to be turned on in one direction, the data in the memory device cannot be erased or reset after being programmed.

SUMMARY OF INVENTION

An object of the present invention is to provide a resistance random access memory and method of fabricating the same to make Type 1R1T RRAM erasable and programmable.

Another object of the present invention is to provide a high integration solution for a resistance random access memory and method of fabricating the same.

The present invention provides a resistance random access memory structure, comprising: a plurality of word lines in a substrate; a plurality of reset lines coupled to the word lines; a dielectric layer on the substrate; a plurality of memory units in the dielectric layer, each of the memory units includes a bottom electrode, a top electrode and a resistive thin film between the top electrode and the bottom electrode, the top electrodes of the memory units in a same column being coupled to one of the reset lines; and a plurality of the bit lines on the memory units, the top electrodes of the memory units in a same row being coupled to one of the bit lines.

In a preferred embodiment of the present invention, there are a plurality of word line contact windows and a plurality of reset line contact windows in the dielectric layer; each of the word line contact windows is coupled to one of the word lines; each of the reset line contact windows is coupled to one of the reset lines.

The present invention also provides a method for fabricating a resistance random access memory, comprising the steps of: forming a plurality of word lines in a substrate; forming a plurality of reset lines, each of the reset lines being coupled to one of the word lines; forming a plurality of memory units on the substrate, each of the memory unit including a bottom electrode, a top electrode, and a resistive thin film between the top electrode and the bottom electrode, the bottom electrodes of the memory units in a same column being coupled to one of the reset lines; forming a dielectric layer on the substrate, the dielectric layer exposing the memory units; and forming a plurality of bit lines on the memory units, the top electrodes of the memory units in a same row being coupled to one of the bit lines.

In a preferred embodiment of the present invention, the steps of forming the memory units and the bit lines include forming a stack layer on the surface of each of the reset lines; forming the dielectric layer on the substrate, the dielectric layer exposing the stack layers; forming a conducting layer on the dielectric layer and the stack layers; and patterning the conducting layer that are perpendicular to the word lines and the stack layers to form the bit lines and the memory units.

In a preferred embodiment of the present invention, further comprising forming a plurality of word line contact windows and reset line contact windows in the dielectric layer. Each of the word line contact windows is coupled to one of the word lines; each of the reset line contact windows is coupled to one of the reset lines.

The present invention provides an improved Type 1R1D RRAM and its size is smaller than Type 1R1T RRAM. Because the present invention provides reset lines for Type 1R1D RRAM, it can overcome the non-programmability of the conventional Type 1R1D RRAM.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF DRAWINGS

FIGS. 3A–6A are cross-sections (along A–A") of the process of fabricating a resistance random access memory in accordance with a preferred embodiment of the present invention.

FIGS. 3B–6B are cross-sections (along B–B") of the process of fabricating a resistance random access memory in accordance with a preferred embodiment of the present invention.

DETAILED DESCRIPTION

FIGS. 3–6 are top views of the process of fabricating a resistance random access memory in accordance with a preferred embodiment of the present invention. FIGS. 3A–6A are cross-sections (along A–A') of the process of fabricating a resistance random access memory in accordance with a preferred embodiment of the present invention.

FIGS. 3B–6B are cross-sections (along B–B') of the process of fabricating a resistance random access memory in accordance with a preferred embodiment of the present invention.

Figure 1:
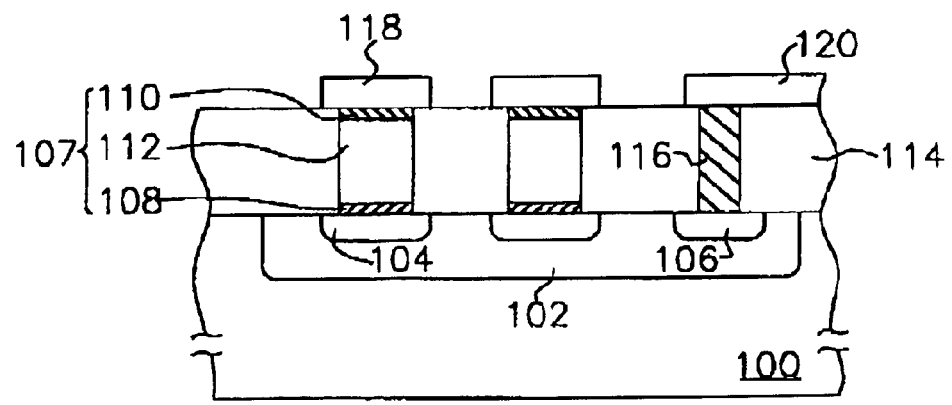
FIG. 1 shows a cross-section of a conventional resistance random access memory device.
Figure 2:
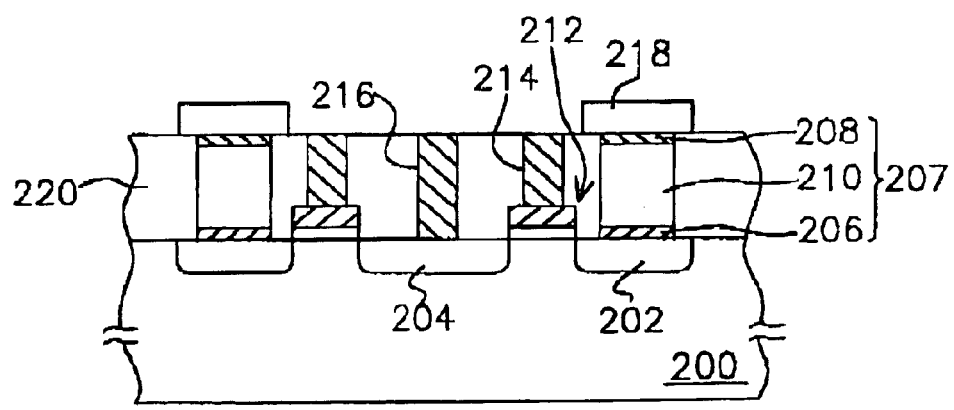
FIG. 2 shows a cross-section of another conventional resistance random access memory device.
Figure 3:
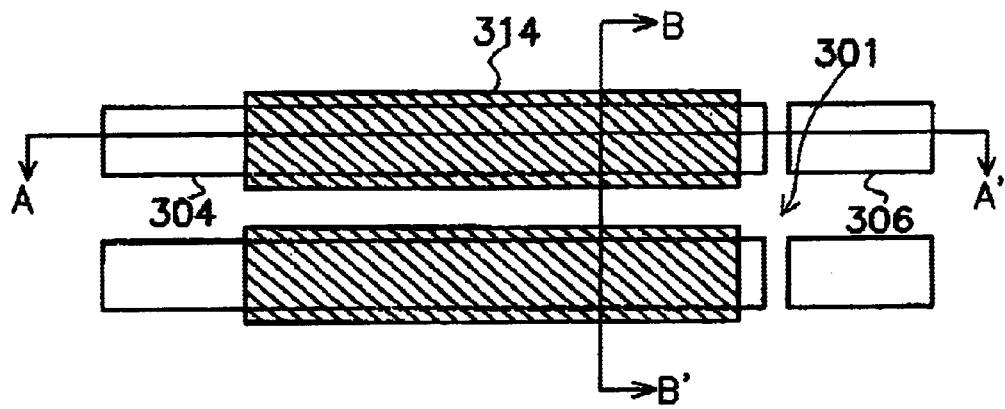
FIGS. 3–6 are top views of the process of fabricating a resistance random access memory in accordance with a preferred embodiment of the present invention.
Figure 3A:
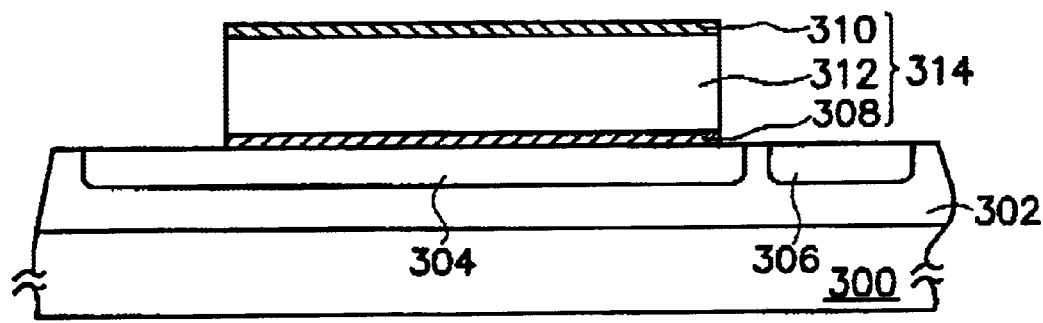
Figure 3B:
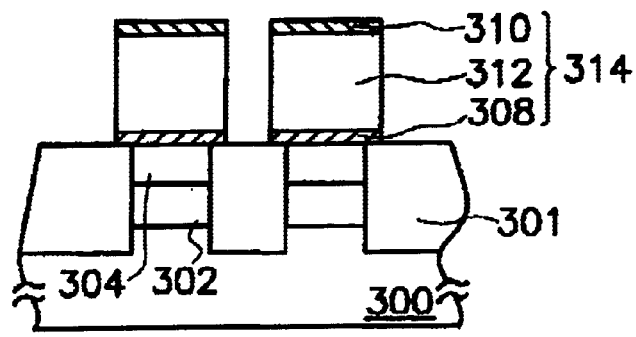

Referring to FIGS. 3, 3A, and 3B, a substrate 300 such as N-type substrate is provided. Then isolated regions 301 are formed in substrate 300. P-type doped regions 302 then are formed between the isolated regions 301 as word lines. The N+ doped region 304 and a P+ doped region 306 are formed in word line 302. The N+ doped region 304 and the P+ doped region 306 constitutes a diode. The N+ doped region 304 is also used as a reset line. The P+ doped region 306 provides the electrical connection between the word line 302 and the subsequently formed word line contact window. In a preferred embodiment of the present invention, P region 302, N+ region 304, and P+ region 306 are formed by ion implantation.

Later, a stack layer 314 is formed on substrate 300, wherein the stack layer 314 is formed on the surface of reset line 304 along the direction of the word line 302 and the reset line 304. Each stack layer 314 includes a bottom electrode 308, a top electrode 310, and a resistive thin film 312 between the bottom electrode 308 and the top electrode 310. In a preferred embodiment of the present invention, the resistive thin film 312 are resistance-reversible materials such as colossal magnet resistive thin films (e.g., PCMO thin film ($Pr_{0.7}Cr_{0.3}MoO_3$)), oxidation films having Perovskite structure (e.g., $Nb_2O_5$, $TiO_2$, $TaO_5$, NiO), or oxidation film such as $SrTiO_3$:Cr; the material of bottom electrode 308 and the top electrode 310 is comprised of a metal such as platinum or gold.

Figure 4:
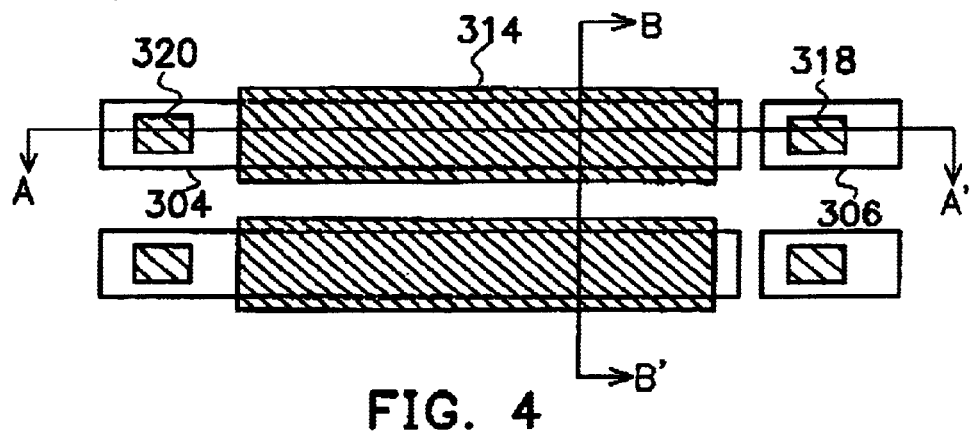
Figure 4A:
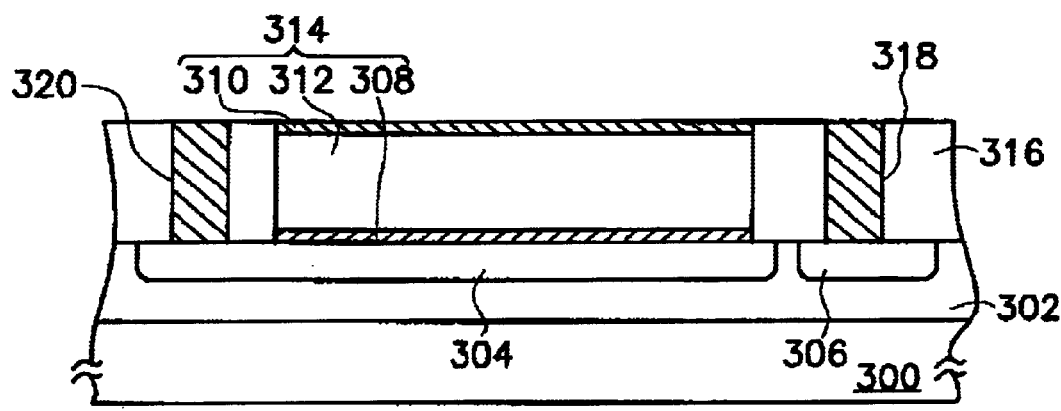
Figure 4B:
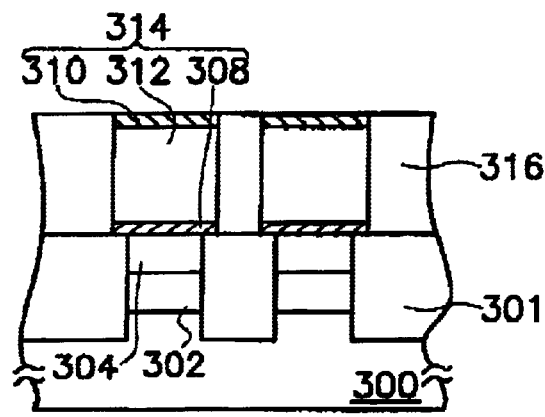

Referring to FIGS. 4, 4A, and 4B, a dielectric layer 316 is formed on the substrate 300 to cover the isolated region 301 except on the stack layer 314, exposing the stack layer 314. In a preferred embodiment of the present invention, the material of dielectric layer 316 can be comprised of a silicon dioxide or a low-k materials; a dielectric layer 316 is formed by depositing a dielectric material layer (not shown in the figures) and then using CMP or etching back to remove a portion of the dielectric material layer until stack layer 314 is exposed.

Then a word line contact window 318 and a reset line contact window 320 are formed in dielectric layer 316, wherein contact window 318 is coupled to the word line 306, and the reset line contact window 320 is coupled to the reset line 304. In a preferred embodiment of the present invention, the word line contact window 318 and the reset line contact window 320 are formed by patterning (by photolithography and etching process) the dielectric layer 316 to expose the P+ region 306 and the N+ region 304 and then filling the openings with a conductive material.

Figure 5:
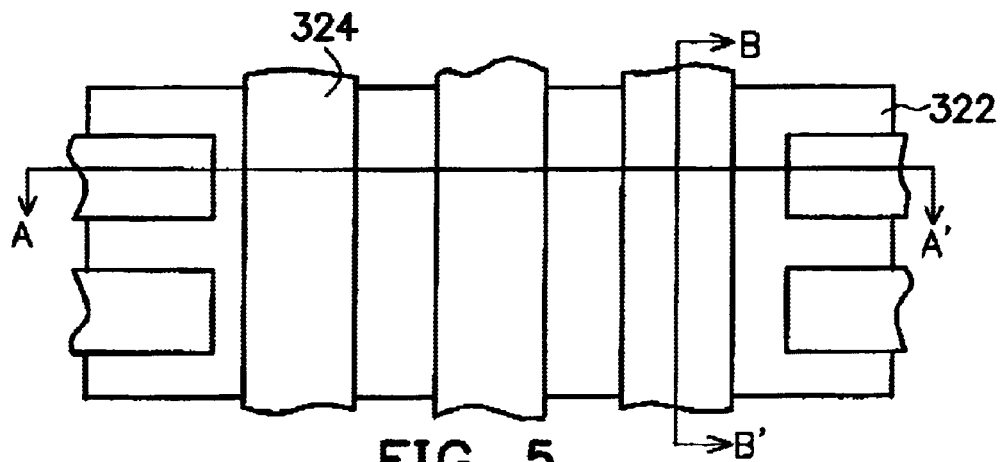
Figure 5A:
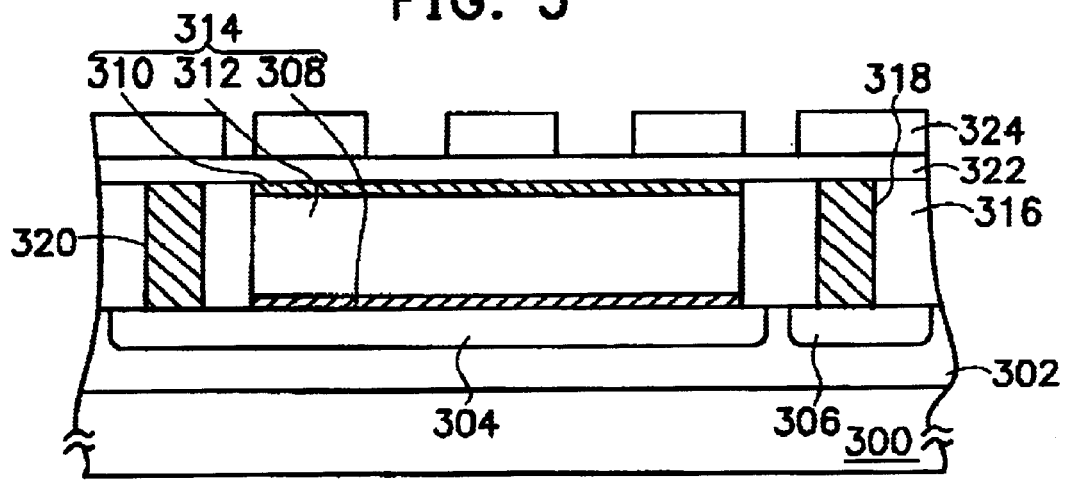
Figure 5B:
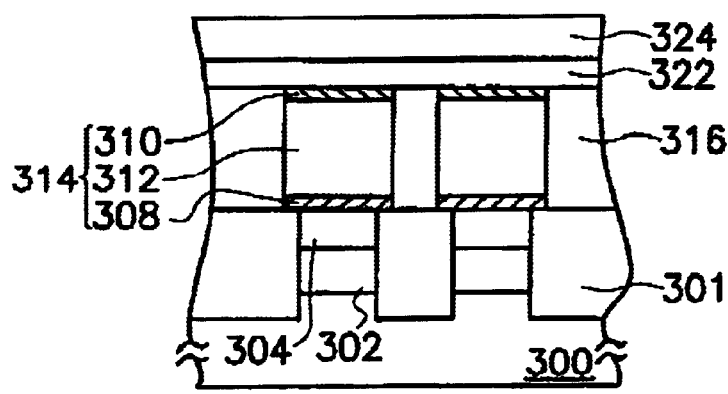

Referring to FIGS. 5, 5A, and 5B, a conducting layer 322 is formed to cover the stack layer 314, the dielectric layer 316, and the contact windows 318 and 320. Then a patterned photoresist layer 324 is formed to cover a predetermined region for bit lines and other conducting lines. The patterned photoresist layer 324 is in the direction perpendicular to the word line 302.

Figure 6:
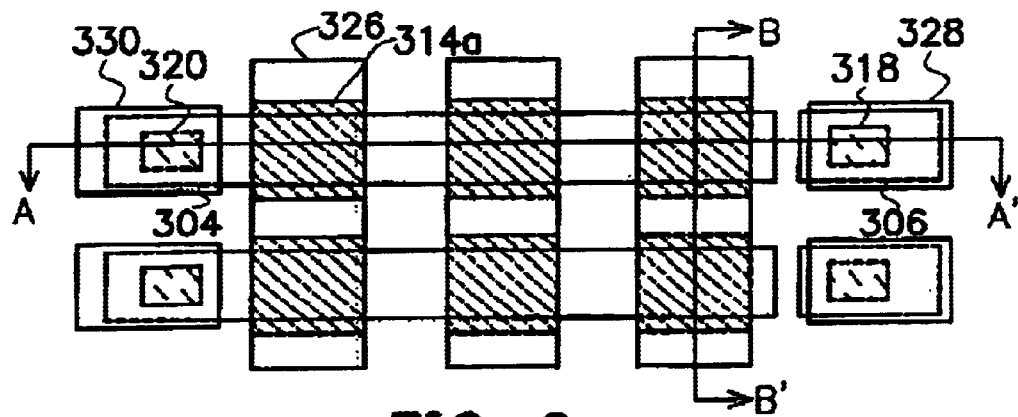
Figure 6A:
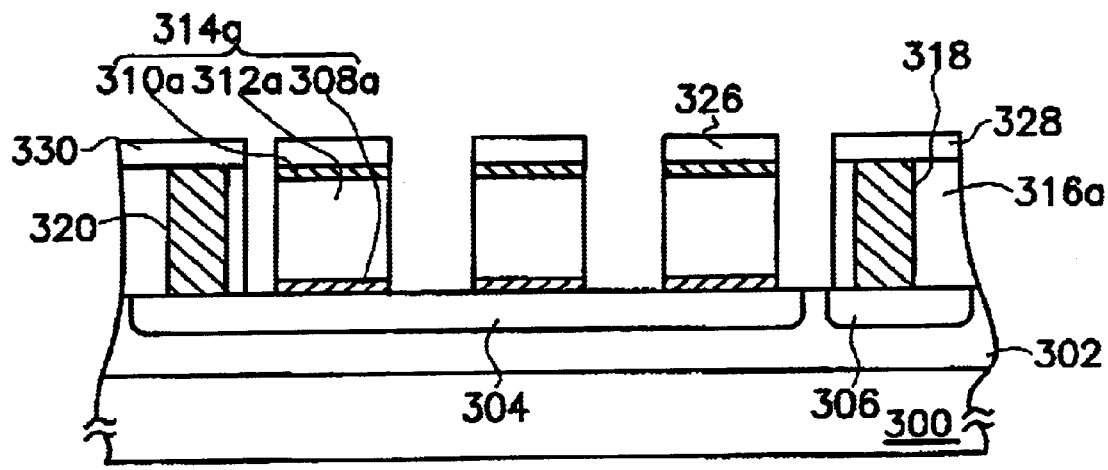
Figure 6B:
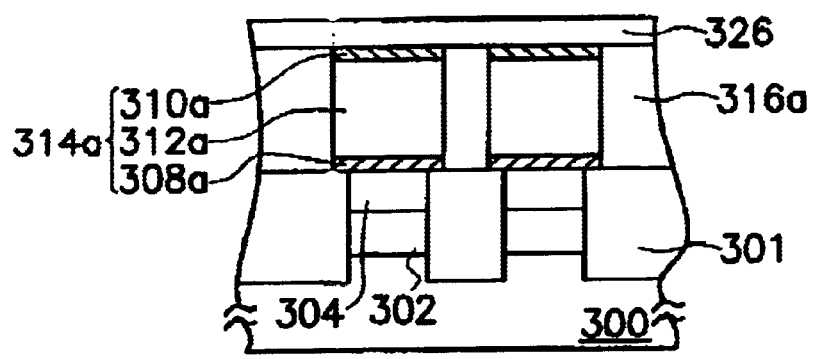

Referring to FIGS. 6, 6A, and 6B, an etching process is performed by using photoresist layer 324 as a mask to pattern conducting layer 322 and thus to form bit line 326 and other conducting lines 328 and 330. During the etching process, the stack layer 314 is also patterned to form memory units 314a (including top electrode 310a, the resistive thin film 311a, and the bottom electrode 308a). Because the bottom electrode 308a of each memory unit in a same column connects together via the reset line 304, therefore the bottom electrode 308 is not required to be patterned. Bit line 326 connects all the memory units in a same row. Furthermore, the word line contact window 318 is coupled to the conducting line 328 so that word line 302 can electrically connect with the external circuits; the reset line contact window 320 is coupled to the conducting line 330 so that the reset line 304 can electrically connect with the external circuits.

An isolated layer (not shown in the figures) is then formed to fill the gaps between the memory units 314a and between the bit lines 326. Then the interconnect and the bonding pad process will be performed.

Figure 8:
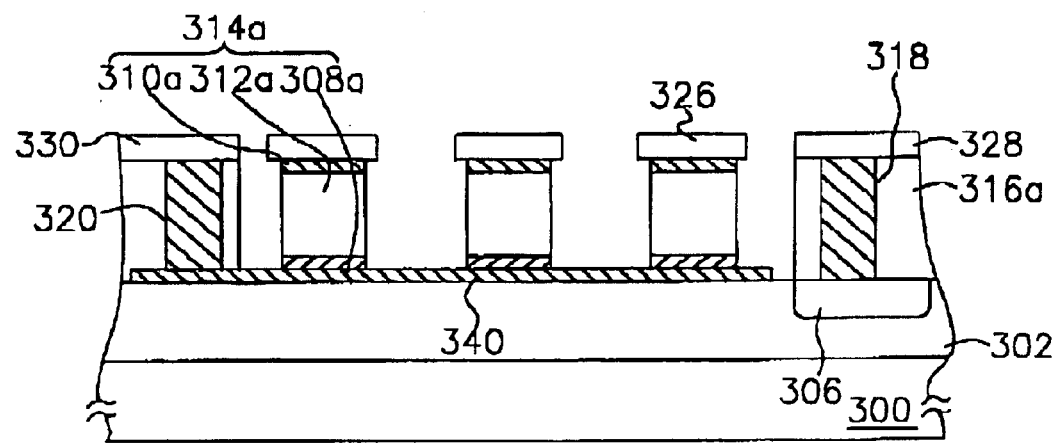
FIG. 8 is a cross-section of a resistance random access memory in accordance with a preferred embodiment of the present invention.

It should be noted that the diode constituted by reset line 304 and word line 302 could be replaced by a Schottky diode. Referring to FIG. 8, after the word line 302 is formed, the reset line 340 is formed on the surface of the corresponding word line 302, wherein the material of reset line 340 is metal. Hence, the reset line 340 and the word line 302 (metal-semiconductor junction) constitutes a Schottky diode.

The aforementioned embodiments choose a certain doped type of semiconductor material for the substrate 300, the word line 302, the reset line 304, and the doped region 306. One skilled in the art may use a semiconductor material doped with a different type of dopante to implement this invention. For example, one skilled in the art can use P-type substrate 300, a N-type word line 302, a P+ doped reset line 304 and a N+ doped region 306.

Hence, the resistance random access memory in accordance with a preferred embodiment of the present invention includes the substrate 300, the isolated region 301, the word line 302, the reset line 304 (or 340), the doped region 306, the memory unit 314a, the dielectric layer 316a, the word line contact window 318, the reset line contract window 320, the bit line 326, and the conducting lines 328 and 320.

Isolated region 301 is set in the substrate 300. Word line 302 is set in the substrate 300 and is positioned between two vicinal isolated regions 301. The reset line 304 is set within a portion of the word line 302 and the ion type of reset line 304 is opposite to that of word line 302 in order to constitute a diode (FIG. 6A.) Further, the reset line 340 can be set on the surface of the corresponding word line 302, wherein the material of the reset line 340 is metal. Hence, the reset line 340 and the word line 302 (metal-semiconductor junction) constitutes a Schottky diode (FIG. 8.) The doped region 306 is set in the word line 302, wherein the ion types of doped region 306 and word line 302 are the same in order to improve the connection between the word line 302 and the subsequently formed word line contact window.

The dielectric layer 316a is set on substrate 300. The memory unit 314a, the word line contact window 318 and the reset line contact window 320 are set in the dielectric layer 316a. The memory unit 314a is set on the surface of reset line 304 (or 340). Each memory unit 314a includes a bottom electrode 308, a top electrode 310a and a resistive thin film 312a between the bottom electrode 308 and the top electrode 310a. In a preferred embodiment of the present invention, the resistive thin film 312 is comprised of a resistance-reversible material such as colossal magnet resistive thin films or oxidation films having Perovskite structure. The word line contact window 318 is coupled to the doped region 306 and the word line 302; the reset line contact window is coupled to the reset line 304 (or 340).

Bit line 326 is set on the memory unit 314a. The bit line 326 is perpendicular to the extension of the word line 302 and connects the memory units in a same row. Furthermore, the conducting lines 328 and 330 are set on the dielectric layer 316a to make the word line 302 and the reset line 304 (or 340) electrically connect with the external circuits.

Figure 7:
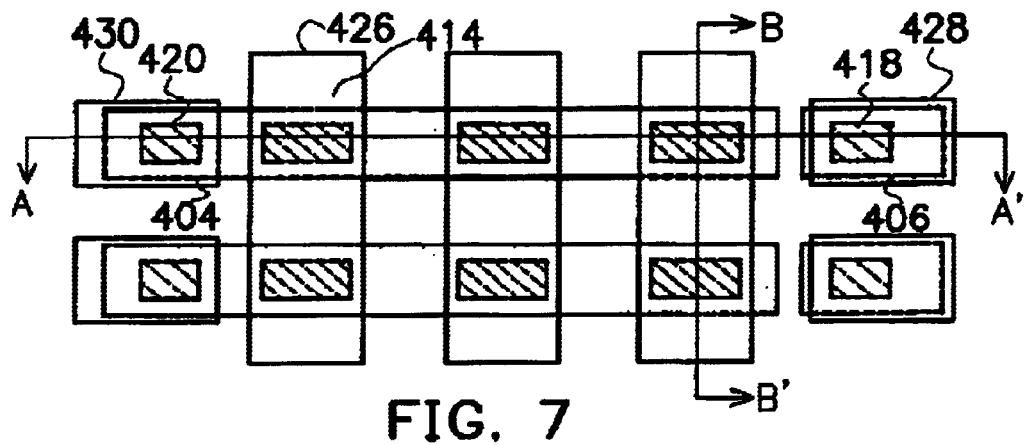
FIG. 7 is a top view of a resistance random access memory in accordance with a preferred embodiment of the present invention.
Figure 7A:
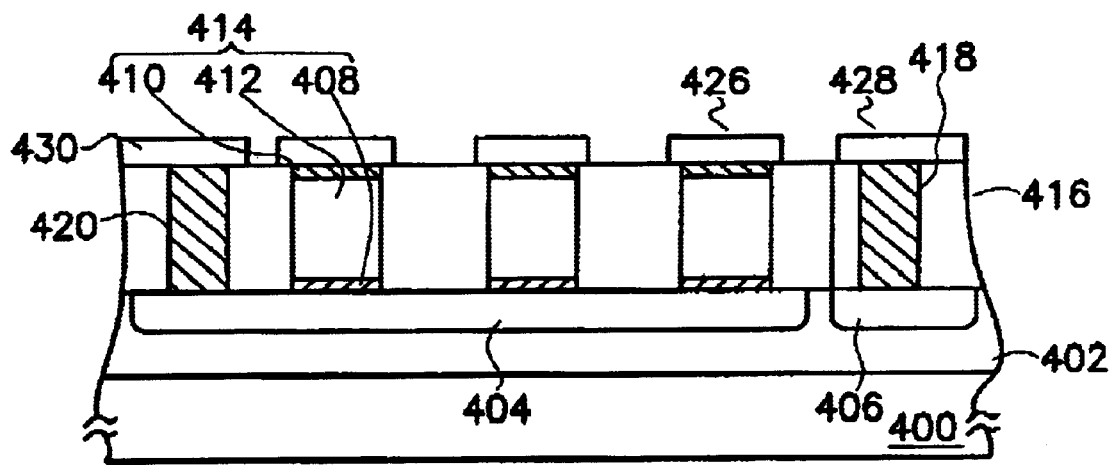
FIGS. 7A–7B are cross–sections (along A–A' and B–B') of a resistance random access memory in accordance with a preferred embodiment of the present invention.
Figure 7B:
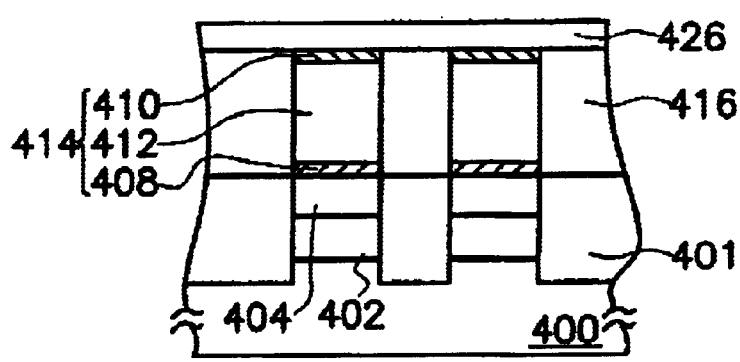

In another preferred embodiment of the present invention, the resistance random access memory of the present invention can be fabricated according to another embodiment. FIG. 7 is a top view of a resistance random access memory in accordance with a preferred embodiment of the present invention. FIGS. 7A–7B are cross-sectional views (taken along line A–A" and line B–B") of a resistance random access memory in accordance with a preferred embodiment of the present invention. Referring to FIGS. 7, 7A, and 7B, isolated regions 401 are formed in the substrate 400. Then P-type doped regions 402 are formed in the substrate 400 as word lines. Then the N+ doped regions 404 and the P+ doped regions 406 are formed in the word lines 402. The N+ doped region 404 and the P doped region 402 constitutes a diode. The N+ doped region 404 is also used as a reset line. The P+ doped region 406 is formed for improving the connection between the word line 402 and the subsequently formed word line contact window.

The a patterned conducting layer is formed on dielectric layer 416 to form the bit line 426 and the conducting linen 428 and 430. The bit line 426 is positioned perpendicular to the extension of word line 402 and connects with the memory units 414 in the same row. Furthermore, the conducting lines 428 and 430 are coupled to the word line contact window 418 and the reset line contact windows 420 respectively to make the word line 402 and the reset line 404 electrically connect with the external circuits.

The a patterned conducting layer is formed on dielectric layer 416 to form the bit line 426 and the conducting lines 428 and 430. The bit line 426 is positioned perpendicular to the extension of word line 402 and connects with the memory units 414 in the same row. Furthermore, the conducting lines 428 and 430 are coupled to the word line contact window 418 and the reset line contact windows respectively to make the word line 402 and the reset line 404 electrically connect with the external circuits.

The aforementioned embodiments choose a certain doping type semiconductor material for the substrate 400, the word line 402, the reset line 404, and the doped region 406. One skilled in the art may use the opposite type of semiconductor material to implement this present invention.

Figure 9:
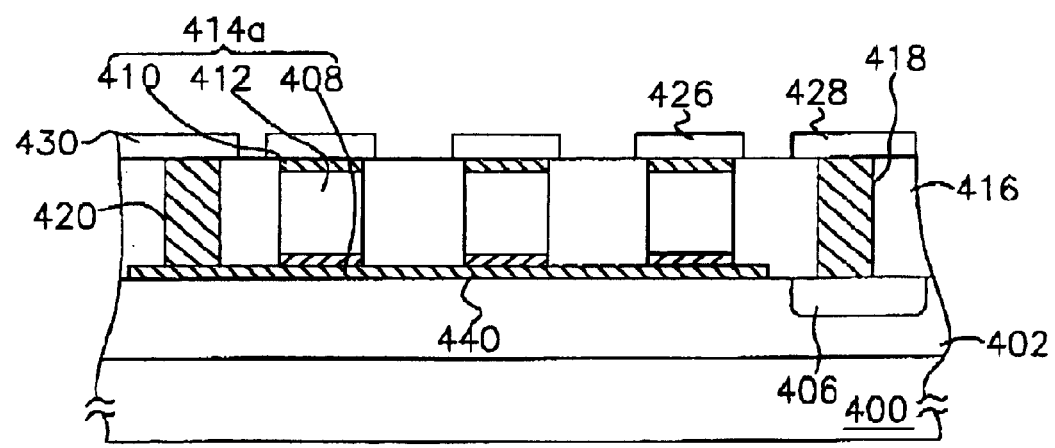
FIG. 9 is a cross-section of a resistance random access memory in accordance with another preferred embodiment of the present invention.

It should be noted that the diode constituted by the reset line 404 and the word line 402 could be replaced by a Schottky diode. Referring to FIG. 9, after the word line 402 is formed, the reset line 440 is formed on the surface of the corresponding word line 402, wherein the material of reset line 440 is comprised of a metal. Hence, the reset line 340 and the word line 402 (metal-semiconductor junction) constitutes a Schottky diode.

The present invention provides an improved Type BRAD RRAM and its size is smaller than Type 1R1T RRAM. Because the present invention provides reset lines for Type GRAD RRAM, it can overcome the non-programmability of the conventional Type GRAD RRAM.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A resistance random access memory structure, comprising:
   a plurality of word lines in a substrate;
   a plurality of reset lines coupled to said word lines, wherein said reset lines are set on the surface of said word lines, and a material of said reset lines is comprised of a metal;
   a dielectric layer on said substrate;
   a plurality of memory units in said dielectric layer, each said memory including a bottom electrode, a top electrode, and a resistive thin film between said top electrode and said bottom electrode, said bottom electrodes of said memory units in a same column being coupled to one of said reset lines; and
   a plurality of said bit lines on said memory units, said top electrodes of said memory units in a same row being coupled to one of said bit lines.

2. The resistance random access memory structure of claim 1, wherein said reset lines are set in said word lines, the ion type of said reset lines being opposite to the ion type of said word lines.

3. The resistance random access memory structure of claim 1, wherein said memory units in a same column ate set on a surface of said reset lines.

4. The resistance random access memory structure of claim 1, wherein said resistive thin film material is resistance-reversible.

5. The resistance random access memory structure of claim 1, wherein said resistive thin film material is selected from colossal magneto resistive thin films and oxidation thin films having Perovskite structure.

6. The resistance random access memory structure of claim 1, further comprising a plurality of word line contact windows in said dielectric layer, wherein each of said word line contact windows are coupled to one of said word lines.

7. The resistance random access memory structure of claim 6, further comprising a plurality of doped regions in said word lines, wherein each of said doped regions are coupled to one of said word line contact windows, and wherein an ion types of said doped regions and said ward lines is same.

8. A resistance random access memory structure, comprising:
   a plurality of word lines in a substrate:
   a plurality of reset lines coupled to said word lines;
   a dielectric layer on said substrate;
   a plurality of memory units in said dielectric layer, each said memory including a bottom electrode, a top electrode, and a resistive thin film between said top electrode and said bottom electrode, said bottom electrodes of said memory units in a same column being coupled to one of said reset lines;
   a plurality of said bit lines on said memory units, said top electrodes of said memory units in a same row being coupled to one of said bit lines; and
   a plurality of reset line contact windows in said dielectric layer, each of said reset line contact windows being coupled to one of said reset lines.

9. The resistance random access memory structure of claim 8, wherein said reset lines are set in said word lines, the ion type of said reset lines being opposite to the ion type of said word lines.

10. The resistance random access memory structure of claim 8, wherein said reset lines are set on the surface of said word lines, and wherein the material of said reset lines is comprised of a metal.

11. The resistance random access memory structure of claim 8, wherein said memory units in a same column are set on a surface of said reset lines.

12. The resistance random access memory structure of claim 8, wherein said resistive thin film material is resistance-reversible.

13. The resistance random access memory structure of claim 8 wherein said resistive thin film material is selected from colossal magneto resistive thin films and oxidation thin films having Perovskite structure.

14. The resistance random access memory structure of claim 8, further comprising a plurality of word line contact windows in said dielectric layer, wherein each of said word line contact windows are coupled to one of said word lines.

15. The resistance random access memory structure of claim 14, further comprising a plurality of doped regions in said word lines, wherein each of said doped regions are coupled to one of said word line contact windows, and wherein an ion types of said doped regions and said word lines are the same.

* * * * *